US006218908B1

United States Patent
Oberhammer

(10) Patent No.: US 6,218,908 B1
(45) Date of Patent: Apr. 17, 2001

(54) METHOD AND APPARATUS FOR THE INJECTION LOCK OF REDUNDANT OSCILLATORS

(75) Inventor: Wolfgang W. Oberhammer, Ottawa (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/434,399

(22) Filed: Nov. 5, 1999

(51) Int. Cl.[7] ............................................. H03L 7/07

(52) U.S. Cl. ........................ 331/56; 331/46; 331/47; 455/260

(58) Field of Search ................... 331/46, 55, 56, 331/99, 107 SL, 47; 455/260, 264, 265

(56) References Cited

U.S. PATENT DOCUMENTS 4,763,085 * 8/1988 Lamberg.

* cited by examiner

Primary Examiner—Arnold Kinkead

(57) ABSTRACT

A coupled oscillator arrangement is provided comprising first and second VCOs (voltage controlled oscillators), and a bi-directional interconnect which injection locks the first and second VCOs to each other. Advantageously, this provides a mechanism which effectively eliminates the phase jitter between the phase of first and second VCOs which makes them suitable for use in a diversity receiver, while at the same time providing a redundancy arrangement in which the failure of one of the VCOs does not effect the functionality of the other. The use of a bi-directional interconnect minimizes the complexity and cost of coupling the two VCOs. Preferably, the bi-directional interconnect injects a first signal representative of an output signal of the first VCO to the output of the second VCO and injects a second signal representative of an output signal of the second VCO to the output of the first VCO.

14 Claims, 2 Drawing Sheets

METHOD AND APPARATUS FOR THE INJECTION LOCK OF REDUNDANT OSCILLATORS

FIELD OF THE INVENTION

The invention relates to a method and apparatus for the injection lock of redundant oscillators, such as local oscillators in multichannel diversity receivers.

BACKGROUND OF THE INVENTION

Dual-diversity reception systems feature a pair of receivers configured to provide both diversity reception functionality, and redundancy such that should one of the receivers fail, the remaining receiver can take over thereby avoiding any loss of service. Such dual-diversity arrangements are common in wideband receivers.

There is a common relatively low frequency reference oscillator used by each receiver to drive the frequency of a respective much higher frequency local oscillator through a phase locked loop. Two independent higher frequency local oscillators are required for redundancy.

Diversity outputs are often combined using maximum ratio combining. It is important that the relative phase of the diversity outputs be somewhat constant within a burst for this maximum ratio combining to be effective. Using conventional phase locked loops avoids the requirement for complex custom multiloop phase locked loops. However, these phase locked loops utilize dividers with large local oscillator-to-reference frequency ratios, for example as large as 50000. This means that the high frequency oscillators in the two receivers are updated relatively infrequently, for example every 0.2 µs. The relative phases of the two local oscillators are thus allowed to drift relative to one another. The result is considerable phase jitter between the two oscillators' output frequencies even though they are derived from the same reference.

While it would be possible to have both receivers configured to exist on the same circuit board using a common oscillator, this defeats one of the advantages of having a diversity reception system, namely that protection is provided against single point failure. If one receiver fails, the remaining of the two receivers can continue to be used with some reduction in sensitivity. The fact that the two receivers are implemented on separate circuit boards further complicates the task of getting the oscillators to operate in phase.

SUMMARY OF THE INVENTION

It is an object of the invention to obviate or mitigate one or more of the above-identified disadvantages.

A broad aspect of the invention provides a coupled oscillator arrangement comprising first and second VCOs (voltage controlled oscillators), and a bi-directional interconnect which injection locks the first and second VCOs to each other. Advantageously, this provides a mechanism which effectively eliminates the phase jitter between the phase of first and second VCOs which makes them suitable for use in a diversity receiver, while at the same time providing a redundancy arrangement in which the failure of one of the VCOs does not effect the functionality of the other. The use of a bi-directional interconnect minimizes the complexity and cost of coupling the two VCOs.

Preferably, the bi-directional interconnect injects a first signal representative of an output signal of the first VCO to the output of the second VCO and injects a second signal representative of an output signal of the second VCO to the output of the first VCO.

Preferably, the bi-directional interconnect has a first coupler into which is coupled a first coupled signal which is a coupled portion of the output signal of the first VCO, a second coupler into which is coupled a second coupled signal which is a portion of the output signal of the second VCO, and a conductive path which conducts the first coupled portion to the output of the second VCO and simultaneously conducts the second coupled portion to the output of the first VCO.

The conductive path might for example be a first conductive portion from a first end of the first coupler to a first end of the second coupler, a second conductive portion from a second end of the first coupler to the output of the first VCO, and a third conductive portion from a second end of the second coupler to the output of the second VCO.

Signal isolation is preferably provided with a buffer arrangement consisting of a first buffer between the output of the first VCO and the first coupler, a second buffer between the output of the second VCO and the second coupler, a third buffer which buffers the signal connected to the output of the first VCO and a fourth buffer which buffers the signal connected to the output of the second VCO.

Typically, the first and second VCOs form part of respective receiver paths and have their respective support structures, for example respective printed circuit boards. The interconnect in such cases may include an interconnecting wire which physically connects the two separate printed circuit boards.

Furthermore, the first VCO would typically be part of a first phase locked loop and the second VCO would typically be part of a second phase locked loop. In such embodiments, a reference oscillator is connected to function as a reference for each of the first and second phase locked loops, typically through a divider circuit.

In some embodiments, it may be necessary or convenient to provide a phase adjust circuit, wherein the divided reference oscillator signal is passed directly to the first phase locked loop, and is passed to the second phase locked loop through the phase adjust circuit.

Embodiments also provide a receiver and a wide band receiver including such an oscillator arrangement.

Another embodiment provides a coupled oscillator arrangement comprising first and second VCOs (voltage controlled oscillators), and a first unidirectional interconnect which injection locks the first VCO to the second VCO and a second unidirectional interconnect which injection locks the second VCO to the first VCO.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
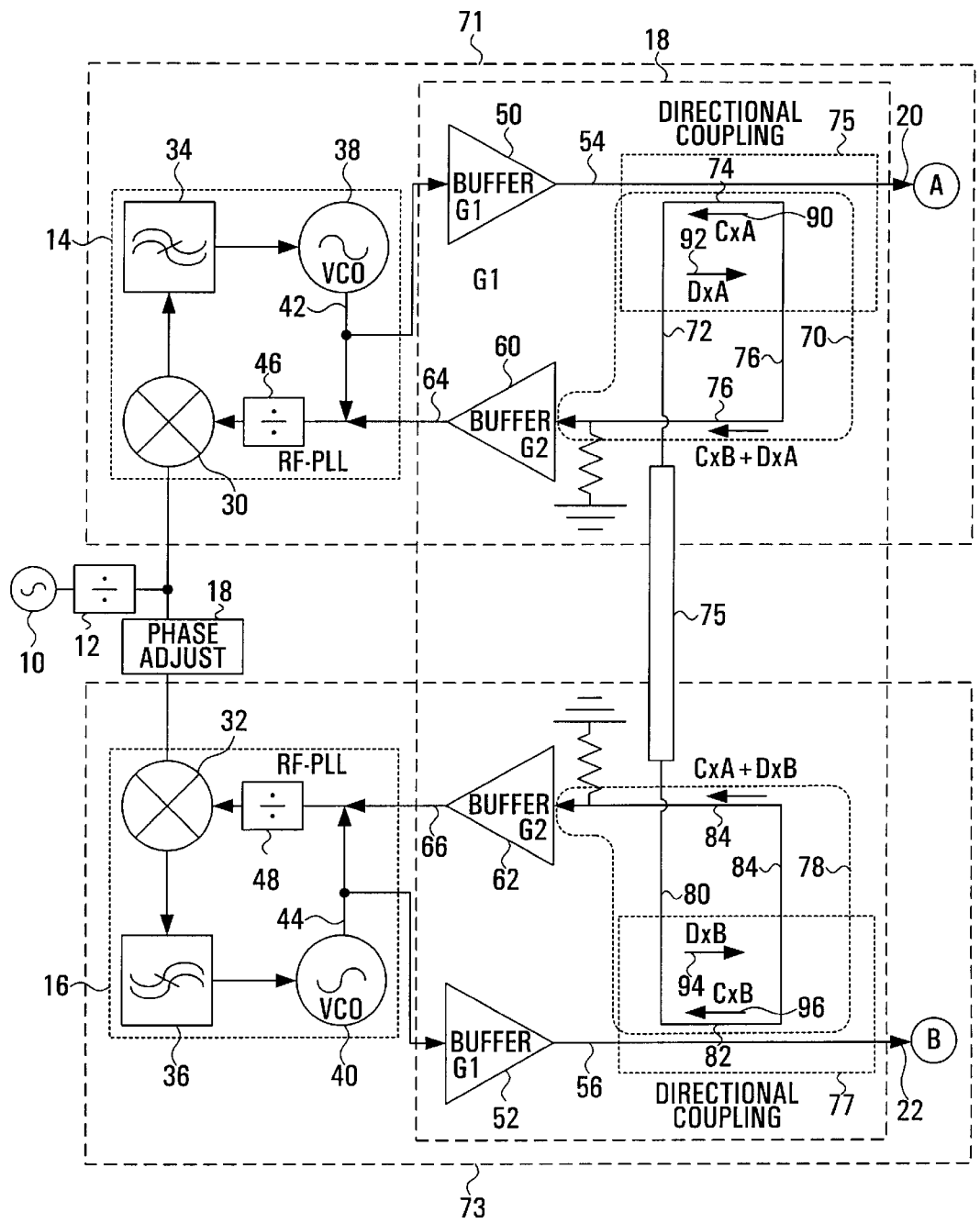
FIG. 1 is a circuit diagram of a coupled oscillator arrangement featuring the injection lock of redundant oscillators, according to a first embodiment of the invention.

Referring firstly to FIG. 1, shown is a coupled oscillator system provided by an embodiment of the invention designed to provide two independent local oscillator signals which have frequencies based on the frequency of a common reference oscillator, with very little phase jitter between the two local oscillator signals. A reference oscillator 10 is shown connected to a divider circuit 12 the output of which is connected directly to a first phase locked loop 14. The divider circuit 12 output is also connected to a second phase locked loop 16 through a phase adjust block 18. An oscillator coupling block 18 is connected to each of the phase locked loops 14,16, and has first and second outputs 20,22 for producing output signals A and B.

Each of the phase locked loops 14,16 features a respective phase comparator/mixer 30,32 connected to the divider 12 either directly or through the phase adjust block 18. Within each phase locked loop 14,16 each phase comparator/mixer 30,32 has an output connected to a respective loop filter 34,36 which is in turn connected to a respective local voltage controlled oscillator 38,40. The output 42,44 of each local oscillator 38,40 is connected through a respective divider 46,48 to the respective phase comparator/mixer 30,32.

The reference oscillator 10 might for example be a 4.8 MHz oscillator, and the divider circuit 12 might divide this frequency by 24 to produce a 200 KHz divided reference signal which is input to the two phase locked loops 14,16. The nominal output frequency produced by the phase locked loops 14,16 might for example be 1740 MHz. The dividers 46,48 divide the divided local oscillator signal each having a frequency which nominally matches the frequency of the signals produced by the respective local oscillator 38,40 to produce a respective divided reference frequency. For our example in which the nominal local oscillator frequency is 1740 MHz, and the divided reference frequency is 200 MHz, the dividers 46,48 divide the nominal local oscillator frequency of 1740 MHz by 8700 to produce a signal with a nominal frequency of 200 KHz.

The coupling block 18 has first and second buffer amplifiers 50,52 both having gain G1 which are connected to the outputs 42,44 of the local oscillators 38,40. Output traces 54,56 carry output signals of the buffer amplifiers 50,52 which constitute the output signals A,B of the coupled oscillator arrangement as a whole which are passed on at outputs 20,22 to other components in the receivers, for example to mixer circuitry. The coupling block 18 has third and fourth buffer amplifiers 60,62 both having gain G2 each having an output 64,66 connected to the local oscillator outputs 42,44 in the phase locked loops 14,16. A first coupling circuit trace 70 is shown which has a first portion 72 providing a connection to an interconnect 75, a second "coupling" portion 74 running parallel to the output trace 54 for the first phase locked loop 14, and a third portion 76 connected to the input of the third buffer amplifier 60. Similarly, a second circuit trace 78 is shown which has a first portion 80 providing a connection to the interconnect 75, a second "coupling" portion 82 running parallel to the output trace 56 for the second phase locked loop 16, and a third portion 84 connected to the input of the fourth buffer amplifier 62. In a typical application, the first phase locked loop 14, buffer amplifiers 50,60, output circuit trace 54 and circuit trace 70 would be located on a first printed circuit board 71. The second phase locked loop 16, buffer amplifiers 52,62, output circuit trace 56 and circuit trace 72 would be located on a second printed circuit board 73, and the interconnect 75 provides an interconnection between the two printed circuit boards 71,73. Typically, the reference oscillator is on a separate shelf supplying multiple shelves of equipment.

The interconnect 75 is preferably a transmission line or at least has transmission characteristics having controlled impedance which is matched to the points on the two circuit traces 70,78.

In the absence of the coupling circuit 18, the divider circuit 46 in each phase locked loop 14,16 produces a divided version of the signal produced at local oscillator's output 42,44, and this divided version is compared by the phase comparator/mixer 30,32 to the divided reference signal produced at the output of divider 12. Any difference is translated by the loop filters 34,36 into an adjustment to the voltage driving the local oscillator devices 38,40, either to increase or decrease the local oscillator frequency such that it more closely tracks the reference oscillator. This is conventional phase locked loop functionality.

According to an embodiment of the invention, a first directional coupling 75 is achieved by the proximal location of output trace 54 to coupling portion 74. A second directional coupling 77 is similarly achieved by the proximal location of output trace 56 with coupling portion 94. More specifically, the coupling portions 74,82 of the circuit traces 70,78 are directionally coupled to the output traces 54,56 in such a manner that there is a coupling coefficient C, and a directivity coefficient D. The coupling coefficient C is a measure of how much energy in a signal propagating in output traces 54,56 is coupled into the coupling portion 74,82 is a direction opposite to the propagation direction in the output traces 54,56. The directivity coefficient D is a measure of how much energy is coupled into the coupling portion 74,82 in the same direction as the propagation direction in the output traces 54,56. The coupling coefficient C is much larger than the directivity coefficient D. For example, the coupling coefficient C might be −20 dB, while the directivity coefficient D might by −40 dB. Thus, the coupling of the first coupling portion 74 to the first output trace 54 results in a coupled signal CxA 90 travelling in the coupling portion 74 in a direction opposite to the direction of propagation of signal A in the output trace 54, and a directivity signal DxA 92 travelling in the coupling portion 74 in a direction the same as the direction of propagation of signal A in the output trace 54. Similarly, the coupling of the second coupling portion 82 to the second output trace 56 results in a coupled signal CxB 94 and a directivity signal DxB 96 as indicated. The input the third buffer amplifier 60 is thus the directivity component DxA 92 from the first coupling portion 74 plus the coupling component CxB 94 from the second coupling portion 82 which is received through the interconnect 75, i.e. CxB+DxA. Similarly, the input to the fourth buffer amplifier 62 is CxA+DxB. In both cases, the coupled components are orders of magnitude larger than the directivity components, and as such the inputs to the third and fourth buffer amplifiers 60,62 may be approximated by CxB and CxA respectively.

Preferably, the length of the coupling portions 74,82 have a length which is one quarter the wavelength of the signal being coupled. Shorter lines with impedance adjustments can achieve similar coupling and directivity over a smaller bandwidth.

After passing through the third buffer amplifier 60, a signal effectively equal to CxG2xB is connected to the output 42 of the local oscillator 38 in the first phase locked loop 14. Similarly, a signal effectively equal to CxG2xA is connected to the output 44 of the local oscillator 40 in the second phase locked loop 16. It is a known fact that when a signal source is applied to the output of a voltage controlled oscillator, the voltage controlled oscillator will "injection lock" to the signal source if the frequencies are similar. Preferably, the combined signals are also similar in amplitude. Examining the signals being combined at the output 42 of the first VCO 38 by way of example, prior to passing the output signal through buffer amplifier 50, the VCO produces a signal effectively equal to 1/G1xA. Similarly, the signal feedback from the other circuit board as indicated previously can be approximated by CxG2xA. In order for the amplitudes to be approximately equal, we require that 1/G1 approximately to equal CxG2. This is not an exact requirement however. It is simply preferred that the amplitudes be similar when combined. In addition to having the appropriate gain, the buffer amplifiers should also provide a level of isolation, and preferably at least as much isolation as provided by the directional coupling between the output traces 54,56 and the coupling portions 74,82.

With the instant circuit, when both oscillators 38,40 are working, the output of each oscillator is coupled and injection locked to the other resulting in the elimination of phase jitter between the two outputs. If either of the oscillators fails, the remaining oscillator can continue to function independently. Advantageously, this is achieved using a unique arrangement which requires only a single interconnect 75. While in these examples, it has been assumed that there are two printed circuit board 71,73, more generally the circuitry may be realized on one, two or any other suitable number of circuit boards or support structures.

Any suitable conducting interconnect can be used to fulfil the function of interconnect 75. For example, if a single circuit board is employed then a circuit trace could be used. However, the interconnect should be injection matched to the interface on the two printed circuit boards, i.e. it should behave like a transmission line.

It is noted that mutually phase injecting two oscillators can cause instability. The oscillator phase and frequency are determined by the phase locked loop elements. Having an oscillator try to injection lock and satisfy PLL loop equation simultaneously is only possible if the two phases are very similar. For this purpose, the phase adjust block 18 is provided to allow an adjustment of the phase between the two references to ensure that the phase locked loop phase and injection lock phases agree. Alternatively, the lengths of all the various lines, traces and connections could be carefully designed such that no phase inconsistency results.

Figure 2:
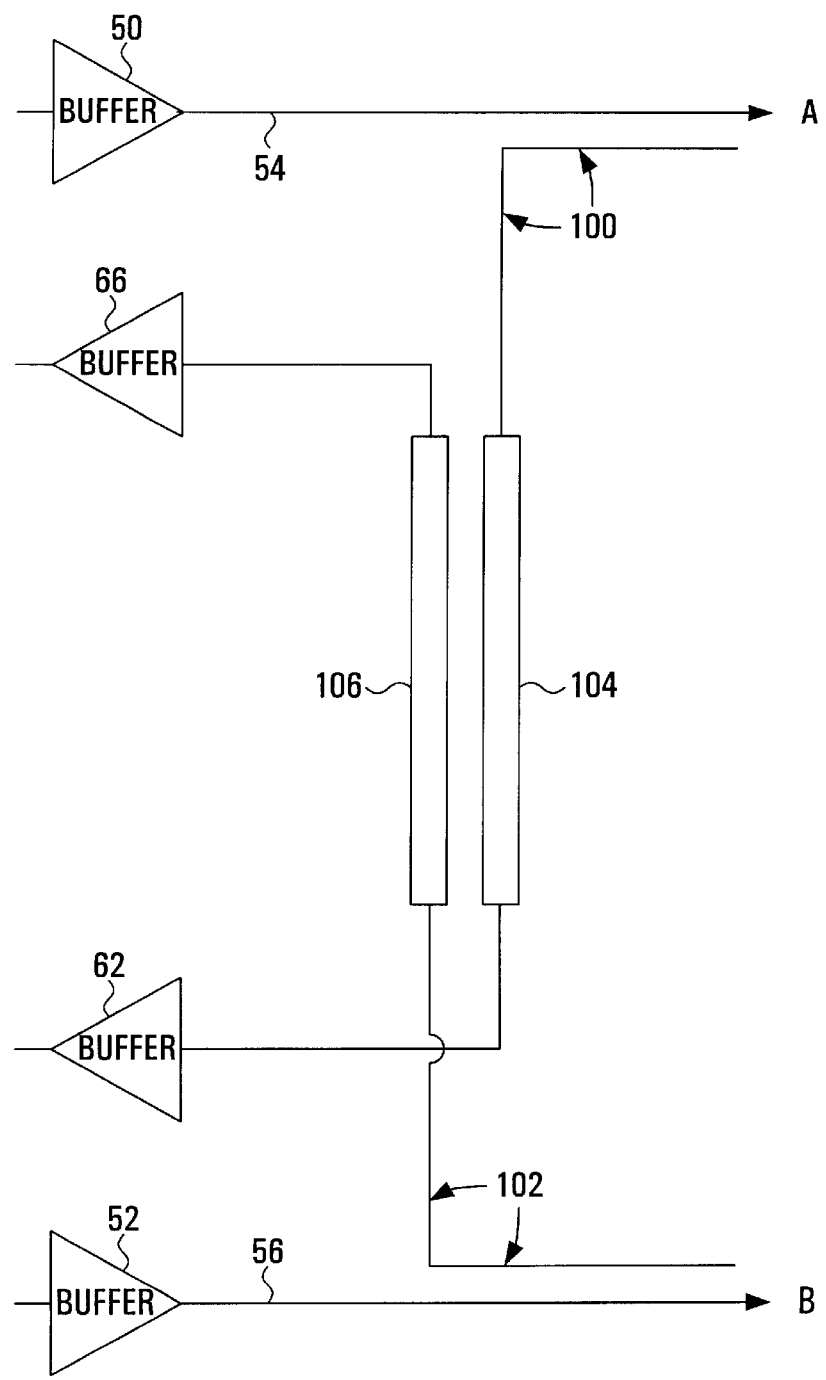
FIG. 2 is a circuit diagram of a coupled oscillator arrangement featuring the injection lock of redundant oscillators, according to a second embodiment of the invention.

FIG. 2 is a circuit diagram for a coupling block according to another embodiment of the invention. Components of the coupling block in FIG. 2 which are in common with the coupling block 18 of FIG. 1 are similarly numbered. In this embodiment, a first circuit trace 100 couples a signal on output trace 54 through a first interconnect 104 to the input of buffer amplifier 62. Similarly, a second circuit trace 102 couples a signal output trace 56 through a second interconnect 106 to the input of buffer amplifier 66. The difference between this embodiment and the previous embodiment is that rather than having a single interconnect 75 to bi-directionally couple between the circuit traces on the two printed circuit boards 71,73 of FIG. 1, two separate unidirectional interconnect wires 104,106 are used.

Numerous modifications and variations of the present invention are possible in light of the above teachings. It is therefore to be understood that within the scope of the appended claims, the invention may be practised otherwise than as specifically described herein.

In the preferred embodiment of the invention, the above discussed coupled oscillator system is applied in a wideband receiver using maximum ratio combining. However, more generally it could be used in any application, system or method requiring the phase tracking of two or more independent sources.

In the illustrated embodiments, directional coupling has been achieved by the proximal adjacent location of coupling portions 74,82 which are portions of larger circuit traces, and the output traces 54,56. It is to be understood that other approaches to obtaining a coupled portion of the output signals may be employed. For example, one can couple multiple traces by cascading the coupled lines to reduce interference among the coupled signals.

All of the illustrated embodiments have included two phase lock loops which are to be coupled together. More generally, a larger number of phase lock loops may be coupled together in a similar manner, by providing a coupling between the signals produced by each phase locked loop with the signal produced by each other phase locked loop. Wilkinson splitters might be used for example to split coupling signals such that they may be coupled to multiple outputs. For example, in the case that there are three receivers, each output would have a directional coupling to produce a coupled signal. Each coupled signal would then be passed through a Wilkinson splitter (or other appropriate splitting device) to produce two copies of the coupled signal. Then each of the coupled signals would be connected to the output of the remaining two receivers.

What is claimed is:

1. A coupled oscillator arrangement comprising first and second VCOs (voltage controlled oscillators), and a bi-directional interconnect which injection locks the first and second VCOs to each other;

wherein each VCO has an output, and wherein the bi-directional interconnect injects a first signal representative of an output signal of the first VCO to the output of the second VCO and injects a second signal representative of an output signal of the second VCO to the output of the first VCO;

wherein the bi-directional interconnect comprises a first directional coupler into which is coupled a first coupled signal which is a coupled portion of the output signal of the first VCO, a second directional coupler into which is coupled a second coupled signal which is a portion of the output signal of the second VCO, and a conductive path which conducts the first coupled portion to the output of the second VCO and simultaneously conducts the second coupled portion to the output of the first VCO.

2. An arrangement according to claim 1 wherein each of the first and second directional couplers have respective first and second ends, and wherein the conductive path comprises:

a first conductive portion from the first end of the first directional coupler to the first end of the second directional coupler;

a second conductive portion from the second end of the first directional coupler to the output of the first VCO; and a third conductive portion from the second end of the second directional coupler to the output of the second VCO.

3. An arrangement according to claim 2 wherein the first conductive portion comprises an interconnecting wire.

4. A coupled oscillator arrangement comprising first and second VCOs (voltage controlled oscillators), and a bi-directional interconnect which injection locks the first and second VCOs to each other;

wherein each VCO has an output, and wherein the bi-directional interconnect injects a first signal representative of an output signal of the first VCO to the output of the second VCO and injects a second signal representative of an output signal of the second VCO to the output of the first VCO;

a first buffer between the output of the first VCO and a first directional coupler, a second buffer between the output of the second VCO and a second directional coupler, a third buffer which buffers the signal connected to the output of the first VCO and a fourth buffer which buffers the signal connected to the output of the second VCO.

5. A coupled oscillator arrangement comprising first and second VCOs (voltage controlled oscillators), and a bi-directional interconnect which injection locks the first and second VCOs to each other;

wherein each VCO has an output, and wherein the bi-directional interconnect injects a first signal representative of an output signal of the first VCO to the output of the second VCO and injects a second signal representative of an output signal of the second VCO to the output of the first VCO;

isolation circuitry which performs amplitude adjustments such that the first signal is similar in amplitude to the output signal of the first VCO, and such that the second signal is similar in amplitude to the output signal of the second VCO.

6. An arrangement according to claim 3 further comprising a first support device on which is located the first VCO and a second support device on which is located the second VCO.

7. An arrangement according to claim 6 wherein the first and second support devices comprise respective printed circuit boards.

8. An arrangement according to claim 1 further comprising a first phase locked loop for the first VCO and a second phase locked loop for the second VCO, and a reference oscillator connected to function as a reference for each of the first and second phase locked loops.

9. An arrangement according to claim 8 further comprising a divider circuit for dividing the frequency of a signal produced by the reference oscillator to produce a divided reference oscillator signal.

10. A coupled oscillator arrangement comprising first and second VCOs (voltage controlled oscillators), and a bi-directional interconnect which injection locks the first and second VCOs to each other;

a phase adjust circuit, wherein a divided reference oscillator signal is passed directly to a first phase locked loop, and is passed to a second phase locked loop through the phase adjust circuit.

11. A receiver comprising the arrangement of claim 1.

12. A wide band receiver comprising the arrangement of claim 1.

13. A coupled oscillator arrangement comprising first and second VCOs (voltage controlled oscillators), and a first unidirectional interconnect which injection locks the first VCO to the second VCO and a second unidirectional interconnect which injection locks the second VCO to the first VCO;

wherein each VCO has an output, and wherein the first unidirectional interconnect injects a first signal representative of an output signal of the first VCO to the output of the second VCO and the second unidirectional interconnect injects a second signal representative of an output signal of the second VCO to the output of the first VCO;

wherein the first unidirectional interconnect comprises a first directional coupler into which is coupled a first coupled signal which is a coupled portion of the output signal of the first VCO and a first conductive path which conducts the first coupled portion to the output of the second VCO, and wherein the second unidirectional interconnect comprises a second directional coupler into which is coupled a second coupled signal which is a portion of the output signal of the second VCO and a second conductive path which conducts the second coupled portion to the output of the first VCO.

14. An arrangement according to claim 9 further comprising a phase adjust circuit, wherein the divided reference oscillator signal is passed directly to the first phase locked loop, and is passed to the second phase locked loop through the phase adjust circuit.

* * * * *